United States Patent
Scheil et al.

(10) Patent No.: US 10,641,813 B2
(45) Date of Patent: May 5, 2020

(54) METHOD FOR CLASSIFYING THE STATUS OF THE WINDING CLAMPING OF A POWER TRANSFORMER

(71) Applicant: ABB Schweiz AG, Baden (CH)

(72) Inventors: Klaus Scheil, Halle (DE); Sebastian Schreiter, Leipzig (DE)

(73) Assignee: ABB SCHWEIZ AG, Baden (CH)

( * ) Notice: Subject to any disclaimer, the term of this patent is extended or adjusted under 35 U.S.C. 154(b) by 252 days.

(21) Appl. No.: 15/880,569

(22) Filed: Jan. 26, 2018

(65) Prior Publication Data

US 2018/0217196 A1 Aug. 2, 2018

Related U.S. Application Data

(63) Continuation of application No. PCT/EP2016/066785, filed on Jul. 14, 2016.

(30) Foreign Application Priority Data

Jul. 27, 2015 (EP) .................................. 15002217

(51) Int. Cl.
*G01R 31/02* (2006.01)
*H01F 27/30* (2006.01)
*H01F 27/40* (2006.01)

(52) U.S. Cl.
CPC ......... *G01R 31/027* (2013.01); *H01F 27/303* (2013.01); *H01F 27/402* (2013.01)

(58) Field of Classification Search
CPC .................................................... H01F 27/303
(Continued)

(56) References Cited

U.S. PATENT DOCUMENTS 9,099,913 B2 * 8/2015 Wass ....................... H02M 1/00
2011/0112777 A1 5/2011 Wass et al.
(Continued)

FOREIGN PATENT DOCUMENTS

| CL | 2117955 C1 | 8/1998 | |
| CN | 101937047 A | 1/2011 | |
| RU | 2643940 C1 * | 2/2018 | ............. G01R 31/06 |

OTHER PUBLICATIONS

Gaouda A M et al: "DSP Wavelet-Based Tool for Monitoring Transformer Inrush Currents and Internal Faults", IEEE Transactions on Power Delivery, IEEE Service Center, New York, NY, US, vol. 25, No. 3, Jul. 1, 2010 (Jul. 1, 2010), pp. 1258-1267, XP011310724.
(Continued)

*Primary Examiner* — Christopher E Mahoney
(74) *Attorney, Agent, or Firm* — Leydig, Voit & Mayer, Ltd.

(57) ABSTRACT

A method for classifying a status of a winding clamping of a power transformer immersed in an oil filled transformer tank, the power transformer including at least one transformer coil with at least one clamped electrical winding arranged on a transformer core, includes the following steps: applying a mechanical force impulse on an impact area of the transformer tank, so that the at least one clamped electrical winding is mechanically excited to vibration and a voltage is induced within the at least one clamped electrical winding; measuring the induced voltage of the at least one clamped electrical winding for a period of time during vibration to generate measurement data; transferring the measurement data from the time domain into the frequency domain and providing a respective dataset comprising the measurement data in the frequency domain; and searching for local maxima within the measurement data in the frequency domain of the dataset.

13 Claims, 5 Drawing Sheets

(58) Field of Classification Search
USPC .......................................................... 324/547
See application file for complete search history.

(56) References Cited

U.S. PATENT DOCUMENTS

2012/0247229 A1* 10/2012 Woodcock .............. G01L 1/242
73/862.624
2018/0128673 A1* 5/2018 Oshetski .................. G01H 9/00

OTHER PUBLICATIONS

Yuxing Wang: "Transformer vibration and its application to condition monitoring", Apr. 1, 2015 (Apr. 1, 2015), pp. 1-184, XP055258638.

* cited by examiner

METHOD FOR CLASSIFYING THE STATUS OF THE WINDING CLAMPING OF A POWER TRANSFORMER

CROSS-REFERENCE TO PRIOR APPLICATION

This application is a continuation of International Patent Application No. PCT/EP2016/066785, filed on Jul. 14, 2016, which claims priority to European Patent Application No. EP 15002217.6, filed on Jul. 27, 2015. The entire disclosures of both applications are hereby incorporated by reference herein.

FIELD

The invention is related to a method for classifying the status of the winding clamping of a power transformer which is immersed in an oil filled transformer tank, wherein the power transformer comprises at least one transformer coil with at least one clamped electrical winding arranged on a transformer core, the method comprising the following steps: applying a mechanical force impulse on an impact area of the transformer tank, so that the at least winding is mechanically excited to vibration and a voltage is induced within the at least one winding therewith, measuring the induced voltage of the at least one winding for a period of time during vibration, transferring those measurement data from the time domain into the frequency domain and providing a respective dataset comprising the measurement data in the frequency domain and searching for local maxima within the measurement data in the frequency domain of the dataset.

BACKGROUND

It is known that windings of power transformers—for example with a rated power of 300 MVA, a rated voltage of 380 kV on the primary side and a rated voltage of 1 10 kV on the secondary side—typically are fixed by a so called winding clamping in order to ensure a sufficient insulation distance in between adjacent winding loops. In case of insufficient winding clamping the active parts of the transformer are not disposed for the mechanical stresses caused by electrical stresses due to high currents occurring in electrical energy distribution networks. In case of short circuits or even a high variation of the load current strong mechanical forces in between the adjacent winding loops are subject to occur. To prevent any mechanical movement respectively deformation of the winding respectively its winding loops the winding is clamped with a respective pressure force at its axial ends. The pressure force in radial direction is mostly withstood by the winding loops itself. Distance elements, for example made from pressboard, are foreseen in between radial adjacent winding layers and/or in between axially adjacent winding loops in order to ensure a sufficient insulation distance and in order to fix the winding structure against mechanical movement.

Due to the occurring forces in between the loops of the winding the winding clamping of a transformer is subject to age over the years of operation, so that one day the functionality might not be sufficient enough to ensure a fault free operation of a respective transformer. In this case the pressure force applied on the winding is typically too low, so that the winding loops are not fixed in a sufficient manner any more.

The aging of a winding clamping of a transformer is not subject to a continuous aging process which is predictable in a good way. Moreover aging is subject to the individual mechanical stress impact on each winding of a respective transformer and is not calculable in a good way therewith. Thus in several cases an individual analysis of the status of the winding clamping of a transformer is required in order to prove whether it is still sufficient or not. In case of a not sufficient status of winding clamping a retrofit has to be done in order to ensure a fault free operation of the transformer for the future.

Analysis of a winding clamping is a rather difficult task since power transformers typically are arranged within an oil filled transformer tank and are not easily accessible therewith. Thus a direct assessment of the winding clamping, for example based on a visual or manual control, is not feasible without removing the power transformer from its oil filled transformer tank.

Assessment methods are known where the winding respectively the winding clamping is mechanically respectively electrically exited to vibration, either by impact of a mechanical force impulse or by applying a current pulse on the winding to be assessed. The winding to be assessed is arranged on the transformer core of the power transformer. Due to the residual magnetism of the transformer core a voltage is induced in the winding when it is vibrating. Vibration of the winding strongly depends on the status of the winding clamping.

The patent document RU 21 17955 discloses a method for analysis of a respective induced voltage, wherein the coil of the power transformer is excited to vibration by a mechanical force impulse on its oil tank. The induced voltage is measured and transferred into the frequency domain. It is assumed that the induced voltage features a peak in the frequency domain at a predetermined frequency which corresponds to the resonance frequency of the winding. Based on the amplitude of this peak a formula is provided for calculating the remaining pressure force of the winding clamping as indicator for the status of the winding clamping.

Disadvantageously within the state of the art is that power transformers typically do not have only one single resonance frequency: power transformers typically have several windings, at least a primary and a secondary winding, which are subject to different pressure forces and to different resonance frequencies therewith. Thus the method according to prior art is subject to fail in many cases.

SUMMARY

In an embodiment, the present invention provides a method for classifying a status of a winding clamping of a power transformer immersed in an oil filled transformer tank, the power transformer including at least one transformer coil with at least one clamped electrical winding arranged on a transformer core, the method comprising: applying a mechanical force impulse on an impact area of the transformer tank, so that the at least one clamped electrical winding is mechanically excited to vibration and a voltage is induced within the at least one clamped electrical winding therewith; measuring the induced voltage of the at least one clamped electrical winding for a period of time during vibration to generate measurement data; transferring the measurement data from the time domain into the frequency domain and providing a respective dataset comprising the measurement data in the frequency domain; and searching for local maxima within the measurement data in the frequency domain of the dataset, the searching comprising: classifying the status of the winding clamping of the at least one clamped electrical winding as defective if there is no distinct maximum within the local maxima; and classifying the status of the winding clamping of the at least one clamped electrical winding as at least possibly sufficient if there is exactly one distinct maximum within the local maxima.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
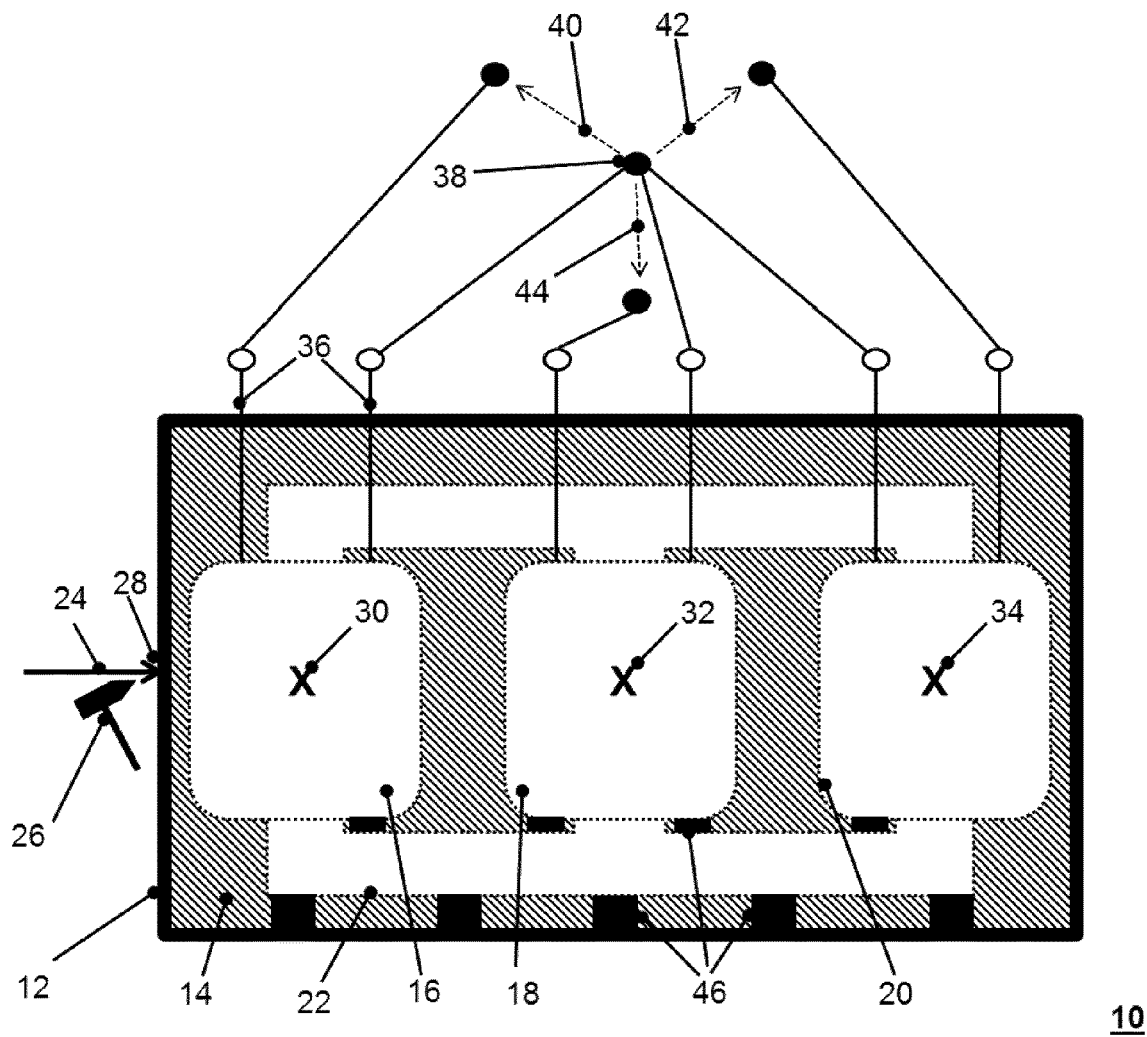
FIG. 1 shows an exemplary power transformer in tank.

The problem is solved by a method for classifying the status of the winding clamping of a power transformer of the aforementioned kind. This is characterized by the following steps:

classifying the status of the winding clamping of the at least one winding as defective in case that there is no distinct maximum within the local maxima, classifying the status of the winding clamping of the at least one winding as at least possibly sufficient in case that there is exactly one distinct maximum within the local maxima.

The idea according of the invention does not assume a peak in the frequency domain at a predetermined frequency, moreover, the invention assumes that the induced voltage of a winding with a sufficient winding clamping features only one significant distinct maximum in the frequency domain, whereas the frequency of the distinct maximum is of secondary relevance. On the other side the invention assumes, that an induced voltage with no distinct maximum respectively with several local maxima, wherefrom no one is significantly more distinct than the others, is a clear indicator, that a winding clamping is not sufficient.

Background for this assumption is, that the winding clamping of a winding or winding section is typically not defect in a homogenous manner along its whole extension, moreover it has been found that in case of a not sufficient winding clamping there are local areas with a defect which differ from other areas with no defect respectively with a different degree of a defect. Thus there are different areas within a not sufficient winding with a respective different status of winding clamping which cause different resonance frequencies.

According to the invention it is foreseen to bring the windings of the power transformer to mechanical vibration by applying a mechanical force impulse on an impact area of the outer surface of the transformer tank, in the easiest case by use of a hammer or the like. Thus all windings of the power transformer will vibrate in a comparable manner, for example for a time span of several 1 s until the vibration has been damped. This enables the synchronous analyzing of several windings of the power transformer in parallel, so that also cross relations in between the three primary and secondary windings of a three phase power transformer can be analyzed for example.

The induced voltage in the frequency domain typically features a relevant frequency spectrum of 2 kHz and above with one or more local maxima. Each maximum is not developed in a sharp manner at exactly one frequency, moreover a maximum can be seen as the peak of Gauss-like distribution around a respective frequency, wherein the width of the peak at half the height of the peak might amount for example 30 Hz. A local maximum which clearly surmounts the other local maxima—if existent—is seen as distinct maximum.

The induced voltages are in typically in the range of very few Volts and below. The measurement of those voltages might be done by use of an automatic measurement circuit with a certain sampling frequency, for example within the range of 5 kHz and above. It has to be ensured that the frequency spectrum of relevance, which might have a maximum frequency of for example 2 kHz, is sampled in an adequate manner, so to say at least with a sampling frequency which is twice as high as the highest frequency of relevance. The transfer from the time domain into the frequency domain can be done for example by use of the method of PSD (Power Spectral Density), FFT (Fast Fourier Transformation) or DFT (Discrete Fourier Transformation).

Thus according to invention the status of the winding clamping of the at least one winding is classified as defective in case that there is no distinct maximum within the local maxima. In this case it can be assumed that there are two or more relevant resonance frequencies indicating that there are at least two areas within the winding with a different status of winding clamping.

Consequently the status of the winding clamping of the at least one winding is classified as at least possibly sufficient in case that there is exactly one distinct maximum within the local maxima. The existence of exact one distinct maximum in one frequency domain is a required but not necessarily a sufficient criterion that also status of the winding clamping is sufficient.

According to another embodiment of the invention the frequency domain covers a maximum frequency of at least 1.5 kHz, preferably at least 2 kHz. It has been found, that by far the most relevant local maxima of measured voltages in the frequency domain are located within this frequency range. Preferably the sampling frequency for measuring the course of the signal of the induced voltage should be at least 10 kHz to ensure a sufficient high data quality within the frequency domain.

According to a further embodiment of the invention the power transformer comprises several windings, wherein a respective dataset is provided synchronously for at least two of those windings and wherein the status of the winding clamping of those at least two windings is classified. This means that during one period of vibration the induced voltage within two or more windings is analyzed synchronously. Thus cross relation analyses in between the frequency spectra of different measured voltages is facilitated therewith since there is an independency on the strength of the applied mechanical force impulse. Thus the strength of the mechanical force impulse has not necessarily to be the same in case that a measurement is repeated.

According to another embodiment of the invention the power transformer is a 3-phase transformer. This is a common embodiment of a power transformer since electrical energy supply networks are typically 3-phased. Thus for a three phase transformer synchronous measurement of for example the induced voltages of the windings of the three phases and synchronous providing of respective datasets can easily be done.

According to a further embodiment of the invention and in case of at least two available datasets with a respective distinct maximum a cross reference in between the frequencies of the distinct maxima is done when classifying the status of a respective winding clamping. This could be in case of a three phase transformer for example synchronously generated datasets for the induced voltage of the primary and/or secondary winding in the frequency domain. If for example all datasets of one or more measurements comprise a distinct maximum at a similar frequency, it can be assumed, that the winding clamping of the transformer are in sufficient condition. It is also possible to identify and eliminate erroneous measurement by such a cross reference respectively by repeating the measurement.

According to another embodiment of the invention the respective winding clamping are classified as sufficient in case that the frequencies of the respective distinct maxima do not differ more than 30 Hz each to each other. It has been found, that there might be slight deviations of the frequencies of distinct maxima in case that the measurements are repeated or in case that several measurements are done synchronously for different windings of the same transformer. According to the invention, it can be assumed for example, that in case of repeating a measurement several times and having respective distinct frequency maxima within a bandwidth of not more than 30 Hz the respective winding clamping is in sufficient condition.

According to another aspect of the invention and in case of a 3-phase transformer an induced voltage within a respective winding is measured in between a respective phase conductor and either a real or virtual neutral point. Thus it is possible to per-form the measurement phase wise without having a negative influence of linked phase voltages.

According to another embodiment of the invention the power transformer comprises a tap changer and the method is repeated sequentially with different tap changer settings. Dependent on the respective tap changer setting additional winding segments are connected electrically in series with a respective main winding of the transformer. Each winding segment as such might be subject to an individual fault. By repeating respective measurements several times at several tap changer settings it is possible to identify a respective defect of a winding and assign it to a certain winding segment which is switched by the tap changer.

According to another embodiment of the invention the steps of the method are repeated at least two times, wherein the impact area of the respective mechanical force impulse is subject to vary or not. By increasing the number of measurements done it is easier to detect and eliminate erroneous measurements. The reliability of a status classifying of a winding clamping is improved therewith.

According to another embodiment of the invention at least one impact area is located on a side wall of the transformer tank across at least one clamped winding to be analyzed. The mechanical force impulse is propagating in a preferred manner to the clamped winding in this case.

According to a further embodiment of the invention the energy of the mechanical force impulse amounts in the range of less than 500 J. It has been found, that on one side the vibrations of the windings are sufficient high for generating a respective induced voltage and on the other side a damage on the surface of the transformer tank is avoided in an advantageous way therewith.

According to another embodiment of the invention the mechanical force impulse is applied in a reproducible manner by respective standardized impulse means. Such a means could be for example a moveable weight, which is accelerated by a spring over a given distance. Thus the mechanical force impulse generated therewith in case that the weight hits on the surface of the transformer tank is always the same.

According to another embodiment of the invention a local maximum in the frequency domain is classified as one distinct maximum in case that it is as least twice as high than the respective other maxima within the frequency domain of the same dataset.

According to a further embodiment of the invention two adjacent local maxima are classified as one local maximum in case that their frequency differs not more than 30 Hz. For example if there is a peak of a maximum at 150 Hz and another peak at 180 Hz it can be assumed, that there is a common peak at 165 Hz. Thus it is avoided, that small deviations within the frequencies lead to a wrong classification of the status of the winding clamping. This proceeding can be repeated, so if there are two already merged maximum peaks which differ not more than 30 Hz each from each other those maximum peaks can be merged once again. Dependent on the size of the transformer and other frame conditions the limit might also amount 50 Hz instead of 30 Hz.

Further advantageous embodiments of the invention are mentioned in the dependent claims.

FIG. 1 shows an exemplary power transformer in an oil 14 filled tank 12. The power transformer comprises a transformer core 22 with three coils 16, 18, 20 arranged around respective limbs of the transformer core 22. On one side of the transformer tank 12 an impulse means 26, in this case a hammer, is indicated for applying a mechanical force impact 24 respectively an impulse on an impact area 28 of the transformer tank 12. In this case the energy of the mechanical force impact 24 amounts 300 J. But of course also other amounts of energy are possible. Thus the applied impulse propagates through the mechanical connections such as wall of the oil tank and the supports oft the coil 14 to the coils 16, 18, 20 and excites them to vibration, for example for several 1 s. Further possible variations of an impact area are indicated with the reference numbers 30, 32, 34, which are located on a side wall of the transformer tank 12 across the coils 16, 18, 20 with their respective clamped windings to be analyzed.

The windings of the coils 16, 18, 20 comprise electrical winding connections 36, wherefrom two are indicated for one respective winding per coil, wherein a coil typically comprises at least a primary and secondary winding. The respective first connections of a respective winding are connected to a common neutral point 38, wherein the respective connections are electrically connected triangular. Respective induced voltages 40, 42, 44 are measured in between the first and second connections of each coil 16, 18, 20 respectively in between the neutral point 38 and the respective second connections.

The induced voltages 40, 42, 44 are measured by respective measuring means and transferred by a computing unit from the time domain to the frequency domain and stored into respective datasets.

Figure 2:
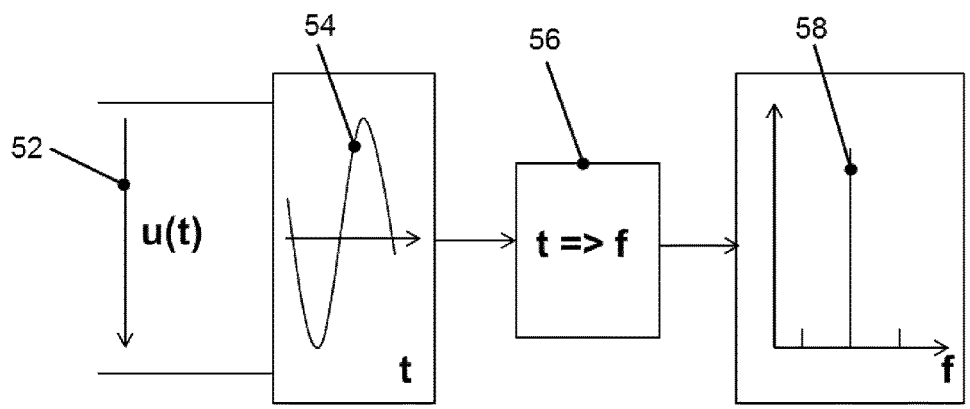
FIG. 2 shows exemplary processing of measurement data.

FIG. 2 shows an exemplary processing of measurement data in a sketch 50. An induced voltage 52 is measured in the time domain so that measurement data 54 are available depending on the time t. Those measurement data 54 are transferred 56 from the time domain into the frequency domain. This might be done for example by use of the method of a Fast Fourier Transformation (FFT). As result therefrom respective measurement data 58 in the frequency domain f are gained. Respective maxima are indicated with a vertical line at the respective frequencies, wherefrom the maximum in the middle can be considered as distinct maximum compared to the other maxima.

Figure 3:
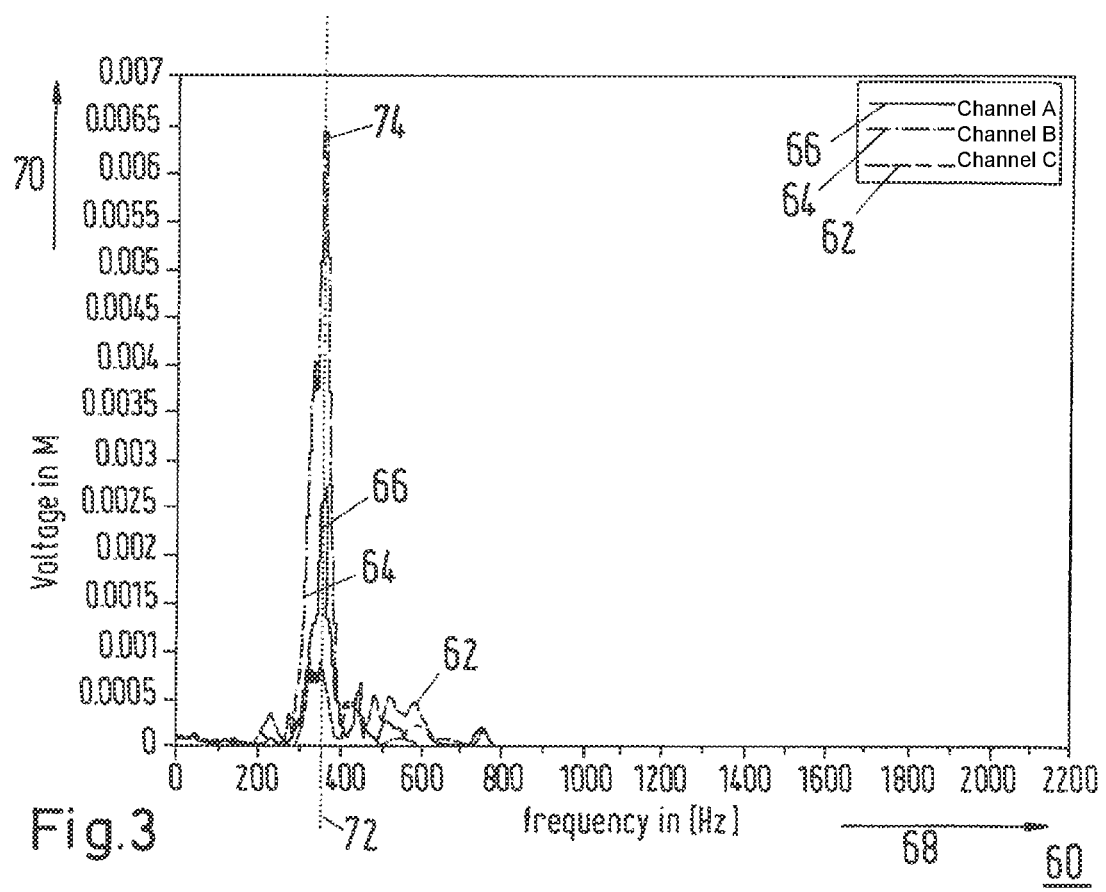
FIG. 3 shows exemplary distinct maxima of measurement data in frequency domain.

FIG. 3 shows exemplary distinct maxima of measurement data in the frequency domain in a sketch 60. The figure shows three different measurement data 62, 64, 66 within the frequency domain, wherein a maximum frequency of 2.2 kHz is considered. In the figure the voltage 70 dependent on the frequency 68 is depicted. The measurement data represent the synchronously measured induced voltages of the three primary windings of a three phase power transformer after applying a mechanical force impulse on the outside of its transformer tank. It can clearly be seen, that all three measurement data comprise a respective significant local maximum approximately 380 Hz, which clearly differs from all other respective local maxima since their respective height is at least twice as high as the height of the respective other maxima. Thus each measurement data has a distinct maximum at frequency 72 of about 380 Hz. The most distinct maximum 74 of all measurement data can be found within the second measurement data 64. The less distinct maximum can be found within the first measurement data 62, which nevertheless still differs as much from the other maxima that it can be considered as distinct maximum. Thus the winding clamping of the respective power transformer can considered to be sufficient.

Figure 4:
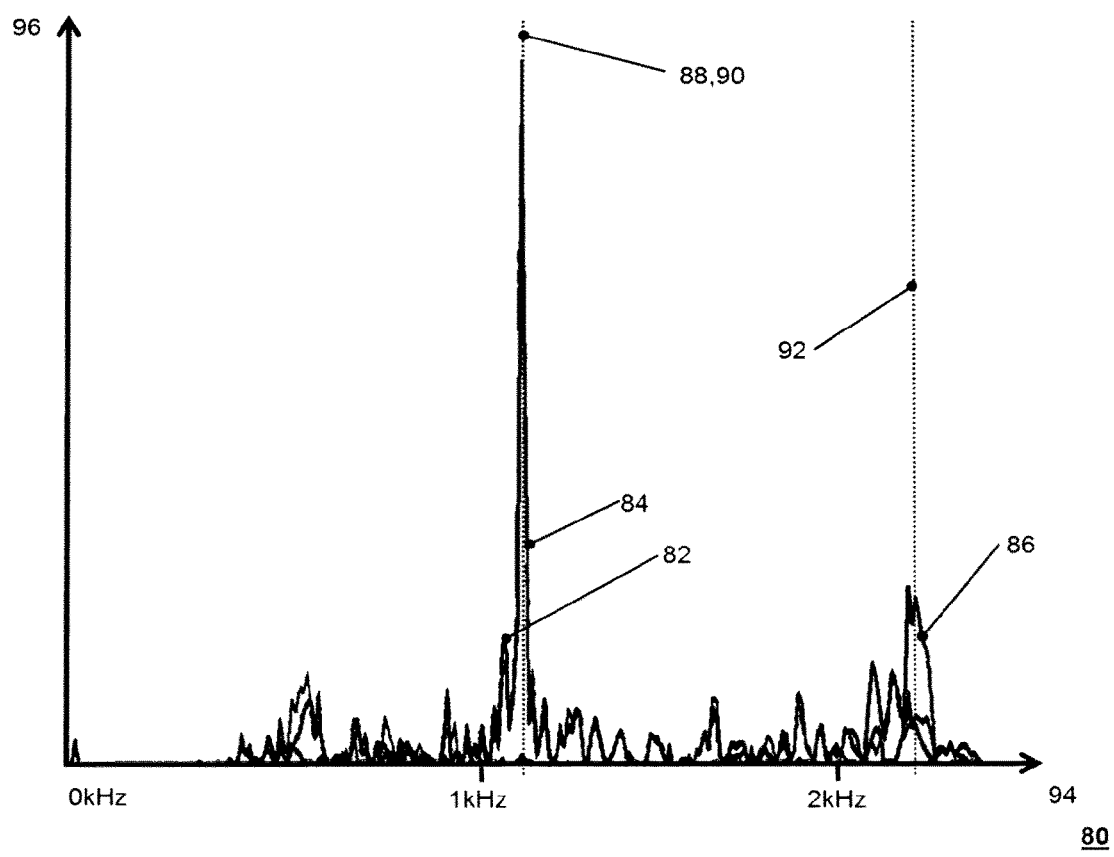
FIG. 4 shows exemplary local maxima of measurement data in frequency domain.

FIG. 4 shows exemplary maxima of measurement data in the frequency domain in a sketch 80. The figure shows three different measurement data 82, 84, 86 within the frequency domain, wherein a maximum frequency of 2.5 kHz is considered. All measurement data have been recorded synchronously and are related to a respective coil of a three phase transformer. In the figure the voltage 96 dependent on the frequency 94 is depicted. It can clearly be seen, that the first 82 and second 84 measurement data have a respective distinct maximum at a respective frequency 88, 90, which is the same for both measurement data at approximately 1.1 kHz. The third measurement data 86 has several local maxima, wherefrom the highest is at a frequency 92 of approximately 2.2 kHz. This differs not as clear from the other local maxima of the third voltage 86, that it could be considered as a distinct maximum. So it can be assumed, that the coil related to the third measurement data has a winding clamping which is not in a sufficient condition whereas the winding clamping of the other two coils is in a sufficient condition.

Figure 5:
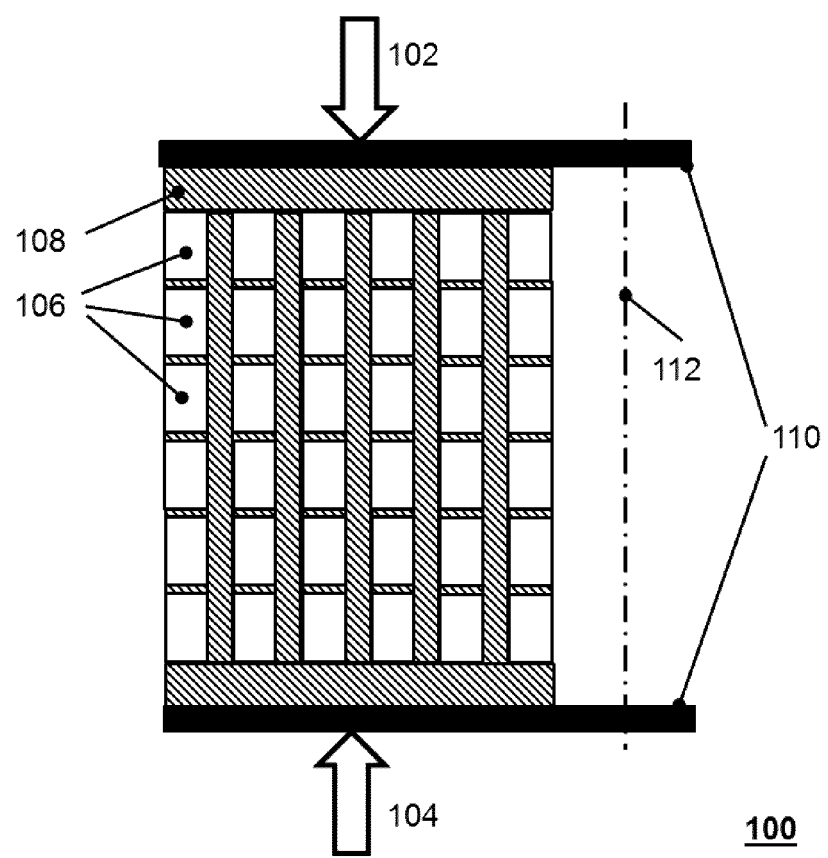
FIG. 5 shows arrangement of an exemplary winding clamping.

FIG. 5 shows an arrangement of an exemplary winding clamping in a sketch 100. A winding of a coil of a power transformer if represented by several layers of axially adjacent winding wires 106, which are wound around an axis of rotation 112. In case of a high current flow through the winding wires 106, for example during a short circuit, a high mechanical force is applied in between the winding wires 106. In order to prevent any mechanical movement in between the winding wires 106 a winding clamping is foreseen, comprising several electrical insulation means 108, for example made from pressboard, and clamping plates for applying an axial pressure force 102, 104 for fixing the winding wires 106. Thus a mechanical movement of those winding wires is prohibited in case that the winding clamping is in sufficient condition.

Figure 6:
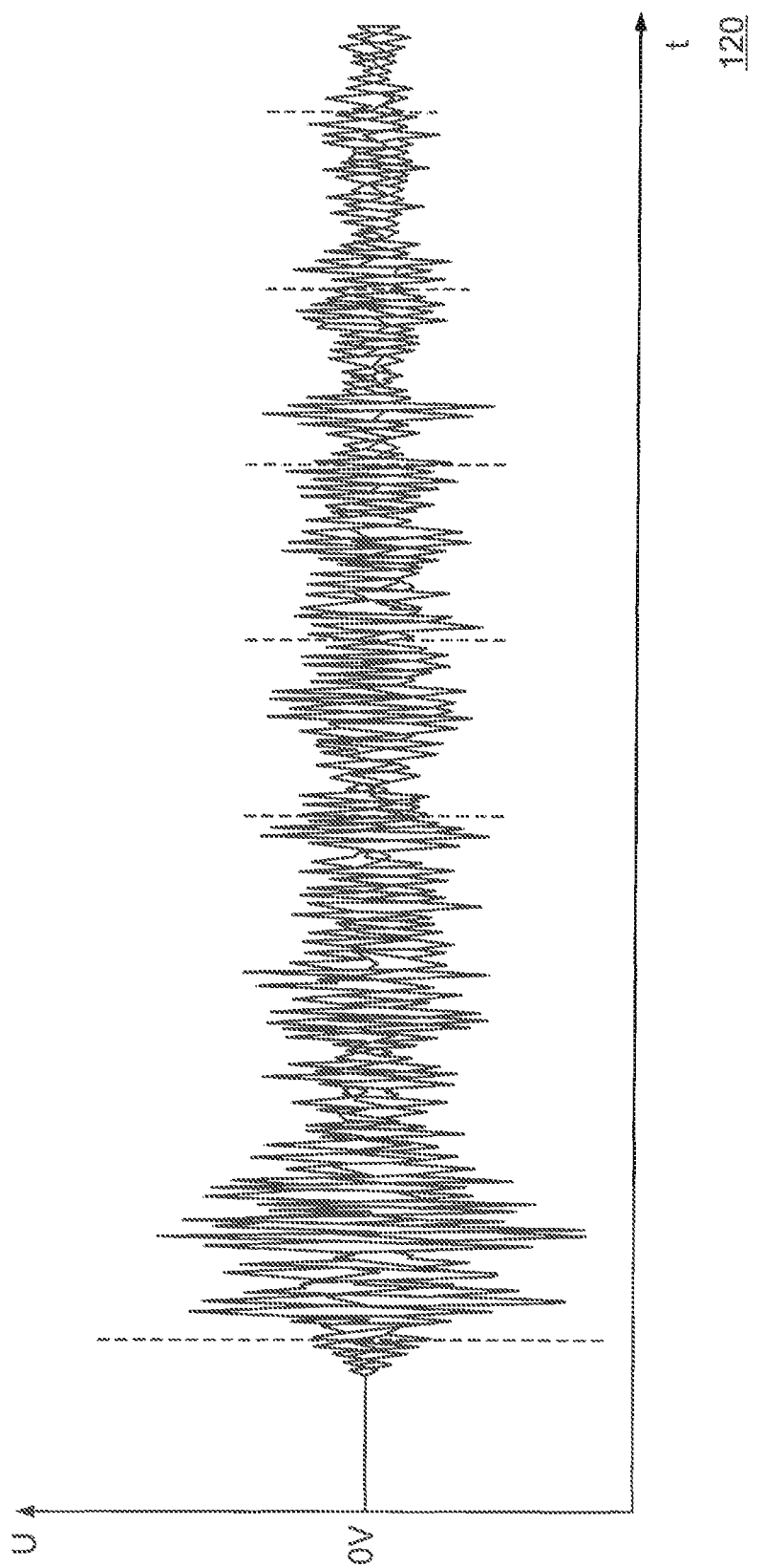
FIG. 6 shows the course of three synchronously induced voltages over time.

FIG. 6 shows the course of three synchronously induced voltages over time in a sketch 120, wherein the monitored time span amounts 60 ms.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 10 exemplary power transformer in tank
12 transformer tank
14 oil
16 first coil
18 second coil
20 third coil
22 transformer core
24 mechanical force impact
26 impulse means
28 first impact area
30 second impact area
32 third impact area
34 forth impact area
36 winding connections
38 neutral point
40 first induced voltage
42 second induced voltage
44 third induced voltage
46 supports
50 exemplary processing of measurement data
52 induced voltage
54 measurement data of induced voltage over time
56 transfer into frequency domain
58 measurement data of induced voltage in frequency domain
60 exemplary distinct maxima of measurement data in frequency domain
62 first measurement data in frequency domain
64 second measurement data in frequency domain 66 third measurement data in frequency domain
68 frequency
70 amplitude
72 frequency of distinct maximum
74 distinct maximum
80 exemplary maxima of measurement data in frequency domain
82 fourth measurement data in frequency domain
84 fifth measurement data in frequency domain
86 sixth measurement data in frequency domain
88 frequency of distinct maximum of fourth measurement data
90 frequency of distinct maximum of fifth measurement data
92 frequency of highest local maximum of sixth measurement data
94 frequency
96 amplitude
100 arrangement of an exemplary winding clamping
102 first pressure force
104 second pressure force
106 winding with winding wires
108 electrical insulation means
110 clamping plates
112 axis of rotation
120 course of induced voltages over time

What is claimed is:

1. A method for classifying a status of a winding clamping of a power transformer immersed in an oil filled transformer tank, the power transformer including at least one transformer coil with at least one clamped electrical winding arranged on a transformer core, the method comprising:
applying a mechanical force impulse on an impact area of the transformer tank, so that the at least one clamped electrical winding is mechanically excited to vibration and a voltage is induced within the at least one clamped electrical winding therewith;
measuring the induced voltage of the at least one clamped electrical winding for a period of time during vibration to generate measurement data;
transferring the measurement data from the time domain into the frequency domain and providing a respective dataset comprising the measurement data in the frequency domain; and
searching for local maxima within the measurement data in the frequency domain of the dataset, the searching comprising:
classifying the status of the winding clamping of the at least one clamped electrical winding as defective if there is no distinct maximum within the local maxima; and
classifying the status of the winding clamping of the at least one clamped electrical winding as at least possibly sufficient if there is exactly one distinct maximum within the local maxima.

2. The method according to claim 1, wherein the frequency domain covers a maximum frequency of at least 1.5 kHz.

3. The method according to claim 1, wherein the power transformer comprises several windings,
wherein a respective dataset is provided synchronously for at least two of those windings; and
wherein the status of the winding clamping of those at least two windings is classified.

4. The method according to claim 3, wherein the power transformer is a 3-phase transformer.

5. The method according to claim 4, wherein the induced voltage within a respective winding is measured in between a respective phase conductor and either a real or virtual neutral point.

6. The method according to claim 3, wherein, in case of at least two datasets with a respective distinct maximum, a cross reference in between the frequencies of the distinct maxima is done when classifying the status of a respective winding clamping.

7. The method according to claim 1, wherein the power transformer comprises a tap changer and the method is repeated sequentially with different tap changer settings.

8. The method according to claim 1, wherein the method is repeated at least two times, and wherein the impact area of the respective mechanical force impulse is subject to vary or not.

9. The method according to claim 8, wherein at least one impact area is located on a side wall of the transformer tank across from the at least one clamped electrical winding to be analyzed.

10. The method according to claim 1, wherein an energy of the mechanical force impulse is in a range of less than 500 J.

11. The method according to claim 1, wherein the mechanical force impulse is applied in a reproducible manner by respective standardized impulse means.

12. The method according to claim 1, wherein a local maximum in the frequency domain is classified as one distinct maximum if it is as least twice as great than respective other maxima.

13. The method according to claim 1, wherein two adjacent local maxima are classified as one local maximum if their frequency differs not more than 30 Hz.

* * * * *